(12) United States Patent
Wang et al.

(10) Patent No.: US 8,492,263 B2
(45) Date of Patent: Jul. 23, 2013

(54) PROTECTED SOLDER BALL JOINTS IN WAFER LEVEL CHIP-SCALE PACKAGING

(75) Inventors: Chung Yu Wang, Hsin Chu (TW); Chien-Hsiun Lee, Hsin Chu (TW); Pei-Haw Tsao, Tai-Chung (TW); Kuo-Chin Chang, Hsin Chu (TW); Chung-Yi Lin, Hsin chu (TW); Bill Kiang, Hsin chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/941,429

(22) Filed: Nov. 16, 2007

(65) Prior Publication Data
US 2009/0130840 A1 May 21, 2009

(51) Int. Cl.
*H01L 21/44* (2006.01)

(52) U.S. Cl.
USPC ........... 438/614; 438/612; 438/613; 438/678; 257/737; 257/738; 257/739; 257/E23.141; 257/E23.142; 257/E23.168; 257/E23.175

(58) Field of Classification Search
USPC .......... 438/614, 613, 612, 675, 678; 257/739, 257/738, E23.168, E23.175, 737, E23.01, 257/E23.141–E23.142
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,466,635 A | 11/1995 | Lynch et al. | |
| 5,481,133 A | 1/1996 | Hsu | |
| 5,736,456 A | 4/1998 | Akram | |
| 5,759,910 A | 6/1998 | Mangold et al. | |
| 6,002,177 A | 12/1999 | Gaynes et al. | |
| 6,107,164 A | 8/2000 | Ohuchi | |
| 6,107,180 A | 8/2000 | Munroe et al. | |
| 6,175,161 B1 | 1/2001 | Goetz et al. | |
| 6,187,678 B1 | 2/2001 | Gaynes et al. | |
| 6,229,216 B1 | 5/2001 | Ma et al. | |
| 6,229,220 B1 | 5/2001 | Saitoh et al. | |
| 6,232,243 B1 | 5/2001 | Farnworth et al. | |
| 6,236,115 B1 | 5/2001 | Gaynes et al. | |

(Continued)

FOREIGN PATENT DOCUMENTS

| | | |
|---|---|---|
| CN | 1375869 A | 10/2002 |
| CN | 1750257 A | 3/2006 |
| JP | 2006-287048 A | 10/2006 |

*Primary Examiner* — Kimberly Rizkallah
*Assistant Examiner* — Maria Ligai
(74) *Attorney, Agent, or Firm* — Slater & Matsil, L.L.P.

(57) ABSTRACT

Protection of a solder ball joint is disclosed in which the solder ball joint is located below the surface level of the encapsulating buffer layer. The buffering layer is etched to expose one or more electrode posts, each of which may be made up of a single column or multiple columns. A top layer resulting either from a top conductive cap or a plating layer around the electrode posts also lies below the buffer layer. When the solder ball is placed onto the posts, the solder/ball joint is protected in a position below the surface of the buffer layer, while still maintaining an electrical connection between the various solder balls and their associated or capping/plating material, electrode posts, wiring layers, and circuit layers. Therefore, the entire ball joint is protected from direct stress.

13 Claims, 8 Drawing Sheets

U.S. PATENT DOCUMENTS

| | | | |
|---|---|---|---|
| 6,271,059 B1 | 8/2001 | Bertin et al. | |
| 6,279,815 B1 | 8/2001 | Correia et al. | |
| 6,323,546 B2 * | 11/2001 | Hsuan et al. | 257/686 |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,454,159 B1 | 9/2002 | Takushima | |
| 6,461,895 B1 | 10/2002 | Liang et al. | |
| 6,562,653 B1 | 5/2003 | Ma et al. | |
| 6,562,665 B1 | 5/2003 | Yu | |
| 6,570,248 B1 | 5/2003 | Ahn et al. | |
| 6,600,222 B1 | 7/2003 | Levardo | |
| 6,600,234 B2 | 7/2003 | Kuwabara et al. | |
| 6,607,938 B2 | 8/2003 | Kwon et al. | |
| 6,661,085 B2 | 12/2003 | Kellar et al. | |
| 6,717,245 B1 | 4/2004 | Kinsman et al. | |
| 6,756,294 B1 | 6/2004 | Chen et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,906,418 B2 | 6/2005 | Hiatt et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,960,829 B2 * | 11/2005 | Hogerl | 257/737 |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,129,575 B1 | 10/2006 | Lin et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,285,867 B2 | 10/2007 | Matsuzaki et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,327,040 B2 * | 2/2008 | Aoki et al. | 257/778 |
| 7,345,350 B2 | 3/2008 | Sinha | |
| 7,370,411 B2 | 5/2008 | Yamano | |
| 7,382,049 B2 | 6/2008 | Ho et al. | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,482,703 B2 | 1/2009 | Hwang et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,820,543 B2 | 10/2010 | Chang et al. | |
| 7,834,450 B2 | 11/2010 | Kang | |
| 2002/0132461 A1 | 9/2002 | Kizaki | |
| 2003/0107137 A1 * | 6/2003 | Stierman et al. | 257/763 |
| 2005/0026416 A1 | 2/2005 | Cheng et al. | |
| 2005/0084989 A1 * | 4/2005 | Wakabayashi et al. | 438/14 |
| 2006/0055032 A1 | 3/2006 | Chang et al. | |
| 2006/0108685 A1 | 5/2006 | Tsou et al. | |
| 2006/0113681 A1 * | 6/2006 | Jeong et al. | 257/780 |
| 2006/0180887 A1 * | 8/2006 | Ono | 257/432 |
| 2006/0207088 A1 * | 9/2006 | Yamano | 29/831 |
| 2006/0211233 A1 * | 9/2006 | Gan et al. | 438/613 |
| 2007/0029654 A1 * | 2/2007 | Sunohara et al. | 257/678 |
| 2007/0145101 A1 | 6/2007 | Kataoka et al. | |
| 2008/0093738 A1 | 4/2008 | Lin | |
| 2008/0296764 A1 | 12/2008 | Chang et al. | |
| 2009/0020869 A1 | 1/2009 | Xue et al. | |
| 2009/0096092 A1 | 4/2009 | Patel | |
| 2009/0108453 A1 | 4/2009 | Lin et al. | |
| 2011/0057313 A1 | 3/2011 | Chang et al. | |
| 2011/0186986 A1 | 8/2011 | Chuang et al. | |
| 2011/0193220 A1 | 8/2011 | Kuo et al. | |
| 2012/0012997 A1 | 1/2012 | Shen et al. | |

* cited by examiner

PROTECTED SOLDER BALL JOINTS IN WAFER LEVEL CHIP-SCALE PACKAGING

TECHNICAL FIELD

The present invention relates generally to wafer level chip scale packaging (WLCSP), and more particularly to enhancing the reliability of solder ball joints in WLCSP.

BACKGROUND

The past few decades have seen many shifts in electronics and semiconductor packaging that have impacted the entire semiconductor industry. The introduction of surface-mount technology (SMT) and ball grid array (BGA) packages were generally important steps for high-throughput assembly of a wide variety of integrated circuit (IC) devices, while, at the same time, allowing reduction of the pad pitch on the printed circuit board. Conventionally packaged ICs have a structure basically interconnected by fine gold wire between metal pads on the die and electrodes spreading out of molded resin packages. Dual inline package (DIP) and quad flat package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP) and BGA are just some of the solutions that enable dense electrode arrangement without greatly increasing the package size. CSP provides for wafer packaging on a chip-size scale. CSP typically results in packages within 1.2 times the die size, which greatly reduces the potential size of devices made with the CSP material. Although, these advances have allowed for miniaturization in electronic devices, the ever-demanding trend toward even smaller, lighter, and thinner consumer products have prompted even further attempts at package miniaturization.

To fulfill market demands toward increased miniaturization and functionality, wafer-level CSP (WLCSP) has been introduced in recent years for generally increasing density, performance, and cost-effectiveness, while decreasing the weight and size of the devices in the electronic packaging industry. In WLCSP, the packaging is typically generated directly on the die with contacts provided by BGA and bump electrodes. Recent advanced electronic devices, such as mobile phones, mobile computers, camcorders, personal digital assistants (PDAs), and the like, utilize compact, light, thin, and very densely packaged ICs. Using WLCSP for packaging smaller die size devices with lower numbers of pins, corresponding to larger number of chips on one wafer, is, therefore, usually advantageous and cost-effective.

One disadvantage of current WLCSP technology is the formation of cracks between the solder ball and the electrode post. The solder ball or bump is typically placed onto the bump electrode or post directly, relying on the soldered joint for structural integrity. The different layers making up the WLCSP device typically have different coefficient of thermal expansion (CTE). As a result, a relatively large stress derived from this difference is exhibited on the joint between the post and the bump electrode, which often causes cracks to form in the bonding area between the bump electrode/post and the solder ball or bump. Additionally, the solder ball is typically located above the layers of the underlying wafer. This exposure makes the solder ball more susceptible to physical impact, and places the more vulnerable joint in an exposed position as well.

FIG. 1 is a cross-section of a typical, single solder ball of WLCSP feature 10. WLCSP feature 10 in formed directly on die 100. Copper pad 102 is formed on die 100. Copper pad 102 acts as a contact and bonding pad for solder ball 101. During the soldering process, intermetallic compounds (IMC) are naturally formed in a layer, i.e., IMC formation layer 103, at the joint between solder ball 101 and copper pad 102. While existence of IMC formation layer 103 generally signifies a good weld between the solder and the substrate, it is usually the most brittle part of the weld. Because the weld joint is so small in WLCSP, cracks, such as crack 104, may form more easily under the stresses experienced at the joint, and such cracks, because of the size of the overall package, may be more damaging. Furthermore, IMC layer 103 is located above the top surface of die 100, thus, exposing this area to greater direct physical impact. A small crack that starts along one side of solder ball 101, such as crack 104, may easily propagate across the length of the straight solder joint.

One method that has been suggested to diminish this stress cracking is described in U.S. Pat. No. 6,600,234, to Kuwabara, et al., entitled, "MOUNTING STRUCTURE HAVING COLUMNAR ELECTRODES AND A SEALING FILM." This method describes forming a sealing film using multiple layers where a portion of the bump electrode protruding from the sealing film. The protruding electrode assists in absorbing part of the stress caused by the difference in CTE. The multiple layers of the sealing film are also selected to have graduated CTE, such that the CTE of the film near the substrate is close to the CTE of the substrate, while the CTE of the film near the circuit substrate is close to the CTE of the circuit substrate. This graduated CTE helps alleviate the stresses that would be cause by sharply different CTE. However, the multiple layers of the sealing film still usually exhibit a weak sheer strength and do not reduce the propagation of any cracks that may form in the IMC layer, thus, reducing the overall reliability of the joint.

An additional method suggested to improve CSP is described in U.S. Pat. No. 6,717,245, to Kinsman, et al., entitled, "CHIP SCALE PACKAGES PERFORMED BY WAFER LEVEL PROCESSING." This method provides for a first bumped layer that is completely encapsulated in an epoxy or other similar material. This encapsulation layer is then polished back to expose the tops of the encased bumps. Regulation solder balls are then printed or placed onto the exposed portions of the first bumped layer. By isolating the solder balls from the circuit board through the first encapsulated layer of bumps, the stress caused by thermal expansion is reduced. However, the ball joints still are subject to cracks that form along the IMC layer, thus again, reducing the overall reliability of the joint.

An additional method suggested to improve CSP is described in U.S. Pat. No. 6,906,418, to Hiatt, et al., entitled, "SEMICONDUCTOR COMPONENT HAVING ENCAPSULATED, BONDED, INTERCONNECT CONTACTS." This method provides two different embodiments for CSP. The first embodiment extends the tip of an interconnect contact from the die pad through an insulating layer. After a metallization layer is deposited on the tip of the interconnect contact, solder balls are placed onto each of the extended tips. The metallization layer is selected to improve the bonding between the metallization material and the solder ball. However, the ball joint is still subject to considerable sheer forces because the ball joint is at or above the surface of the insulating layer. The second embodiment provides for the solder ball to be placed directly onto the die bonding pad or directly onto a redistribution layer. An insulating layer is then used to encapsulate the solder ball leaving a portion exposed for contact. While this embodiment improves the ball joint strength, placing the solder ball directly onto the die contact pads is a complex design process. The level of customization that would occur between the wafer fabrication process and the subsequent packaging process would greatly increase the costs of CSP features. Moreover, the configurations of interconnect contacts would also be limited to the die contact pad configuration.

SUMMARY OF THE INVENTION

These and other problems are generally solved or circumvented, and technical advantages are generally achieved, by preferred embodiments of the present invention which locate the solder ball joint with the electrode posts below the surface level of the encapsulating buffer layer. Locating the joint below the surface level of the buffer layer protects the joint from external sheer forces. Additional improvements are made in selected embodiments by forming each of the electrode posts with multiple columns. Still other embodiments apply a plating layer around the electrode posts (either single or multiple column posts). The plating material may be selected from low-reactive material that reduces the amount of IMC defects that may be formed at the ball joint. Further still, the entire set of posts may be made from materials such as nickel, tin, solder, and the like, thus, decreasing defects that may be caused by deflection of the stiffer copper posts.

In accordance with a preferred embodiment of the present invention, a method for manufacturing a semiconductor device includes forming one or more electrode posts on a first surface of a semiconductor substrate. Each of the electrode posts is made up of an array of two or more columns electrically connected to a wiring layer of the semiconductor substrate. A buffer layer, which encapsulates the array, is deposited over the first surface. Material from the electrode posts is removed so that the top surface of the multi-column electrode posts is exposed at a depth below the top of the buffer layer. A conductive capping layer is then deposited over the top surface of the multi-column electrode posts, where the conductive capping layer also lies below the top of the buffer layer. A solder ball is then placed onto each of the conductive capping layers, wherein a solder joint between the solder ball and the conductive capping layer resides below the top of the buffer layer.

In accordance with another preferred embodiment of the present invention, a semiconductor device is made up of a substrate, a buffer layer on a surface of the substrate, and one or more electrodes embedded within the buffer layer. The electrodes have a plating layer between themselves and the buffer layer, where a top surface of the electrodes lies below an exterior surface of the buffer layer. There is also a solder ball on each of the electrodes, where a solder joint between the solder ball and the conductive capping layer lies below the exterior surface of the buffer layer.

In accordance with another preferred embodiment of the present invention, a method for manufacturing a semiconductor device includes forming a plurality of electrodes on a first surface of a semiconductor substrate, where the electrodes protrude from the first surface. The electrodes are plated with a plating material and covered with a deposited buffer layer through which the plated electrodes extend. Parts of the buffer layer are selectively etched such that a top surface of the electrodes is exposed at a depth below a top of the buffer layer. A solder ball is placed onto the each of the electrodes, such that a joint between the solder ball and the each of the electrodes lies below the top of the buffer layer, and the solder ball is electrically connected to a wiring layer of the semiconductor substrate through the plating material and the electrodes.

In accordance with another preferred embodiment of the present invention, a semiconductor device includes a substrate, one or more electrodes protruding from the surface of the substrate through a buffer layer also on the surface of the substrate. The electrodes are each made up of a plurality of columns, wherein a top surface of the multi-column electrodes lies below a top of the buffer layer. Each of the multi-column electrodes is also covered on an external surface by a plating layer. There are also solder balls on each of the multi-column electrodes, where the solder joint between the solder ball and the plating layer lies below the top of the buffer layer.

An advantage of a preferred embodiment of the present invention is an increased strength and reliability of the solder ball joint. Because the joint is located below the buffer layer, it is protected from direct outside contact.

A further advantage of a preferred embodiment of the present invention is the protection of copper electrodes. In embodiments where the electrode posts are formed using copper, the capping layer protects the copper from oxidizing.

An additional advantage of a preferred embodiment of the present invention configured with multi-column electrodes is an increased strength and reliability of the solder joint. The multiple columns provide a barrier for crack propagation and also supply a redundancy in which the device would remain operable even if a first few of the columns cracked.

Another advantage of a preferred embodiment of the present invention that uses nickel as either a plating material or for the electrodes is the decreased IMC that forms because of the chemical interaction that occurs between nickel and solder. Moreover, because nickel is softer than copper, the electrodes/posts may deflect a greater amount without cracking than copper.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
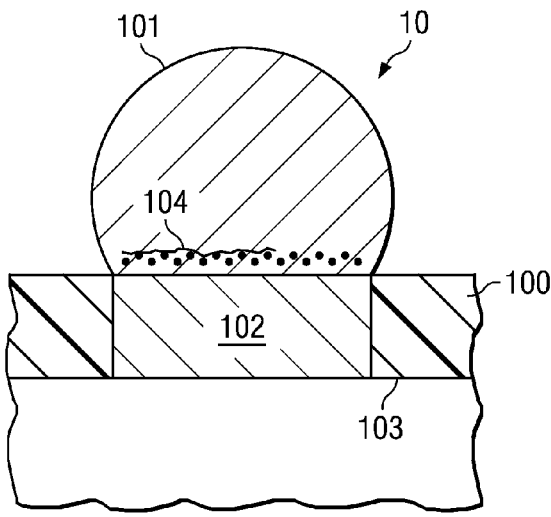
FIG. 1 is a cross-sectional view of a typical, single solder ball of a WLCSP feature.
Figure 2:
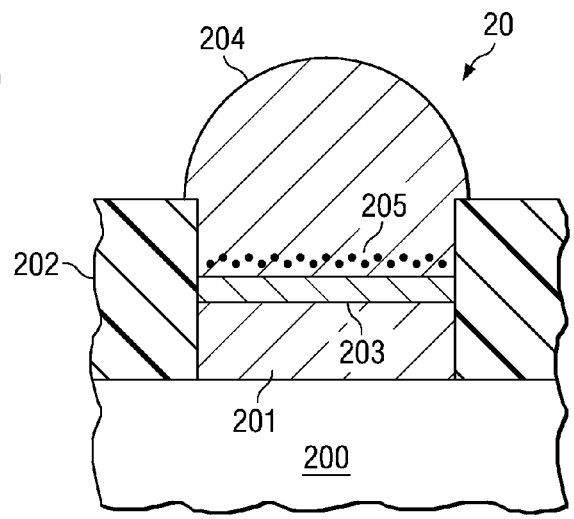
FIG. 2 is a cross-sectional view of a WLCSP feature configured according to one embodiment of the present invention.

With reference now to FIG. 2, there is shown a cross-sectional view of WLCSP feature 20 configured according to one embodiment of the present invention. Wafer 200 includes electrode post 201 formed thereon. Insulating layer 202 is formed on top of wafer 200 and surrounds electrode post 201. During the manufacturing process, electrode post 201 was flush at the top with the top of insulating layer 202. Electrode post 201 is etched back below the level of insulating layer 202. In a preferred embodiment, no extra photoresist layer is used during the etching process because the material for insulating layer 202 is selected, such that etching of electrode post 201 may occur without affecting insulating layer 202.

Capping layer 203 is deposited onto electrode post 201 which protects the material of electrode post 201 from oxidizing. In a preferred embodiment, electrode post 201 is made of copper. Capping layer 203, thus, prevents copper electrode post 201 from oxidizing. Capping layer 203 may be deposited using any number of different methods, including electroless plating, and the like. Solder ball 204 is then welded, soldered, or printed onto wafer 200. The result of the welding places the joint on top of capping layer 203, which is below the top surface of insulating layer 202. Therefore, solder ball 204 is located partially below and partially above insulating layer 202. Moreover, IMC layer 205 forms at the juncture between solder ball 204 and capping layer 203, such that it is protected from direct physical contact by insulating layer 202. By configuring wafer 200 to receive a portion of solder ball 204 above and below insulating layer 202, placing the solder joint below the top surface of insulating layer 202, and protecting electrode post 201 from oxidation by capping layer 205, the solder joint becomes more reliable and exhibits greater sheer and general strength.

Figure 3A:
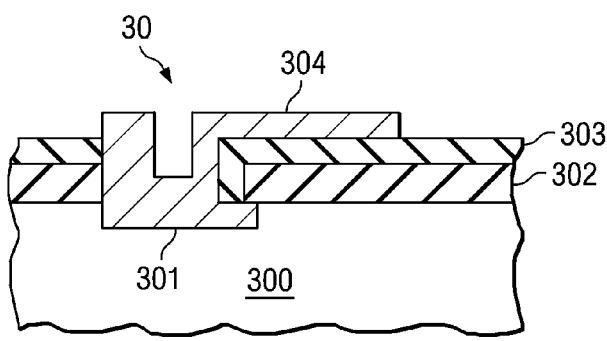
FIGS. 3A-3E are cross-sectional views of an early manufacturing stage of a WLCSP feature configured according to one embodiment of the present invention.

FIG. 3A is a cross-sectional view of an early manufacturing stage of WLCSP feature 30 configured according to one embodiment of the present invention. Die 300 includes passivation layer 302 and polymer insulation layer 303. Wiring layer 301, at the top of die 300, is connected to a circuit layer (not shown) within die 300. Re-distribution layer (RDL) 304 is deposited on the top of polymer insulation layer 303 of die 300. RDL 304 extends the electrical connectivity to wiring layer 301.

It should be noted that polymer insulation layer 303 may comprise various insulating materials, such as polyimide or other such polymer insulator. The descriptions provided in FIGS. 3A-3E are not intended to limit the present invention to any particular material for providing such an insulation layer. In fact, in additional and/or alternative embodiments, construction of an inventive WLCSP feature may not include an insulation layer, such as polymer insulation layer 303.

Figure 3B:
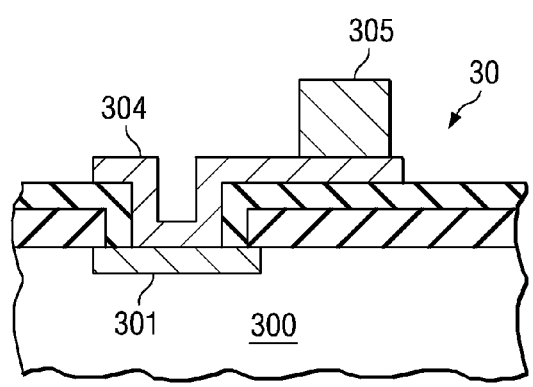

FIG. 3B is a cross-sectional view of another manufacturing stage of WLCSP feature 30 configured according to one embodiment of the present invention. Electrode post 305 is deposited onto die 300. It is physically in contact with RDL 304, which creates an electrical connection with wiring layer 301. Therefore, contact with electrode post 305 may provide electrical connection with the circuit layer in die 300. The material for RDL 304 may be selected from various beneficial conducting materials, such as copper, gold, aluminum, tin, or any beneficial combination or alloy of conducting materials.

Figure 3C:
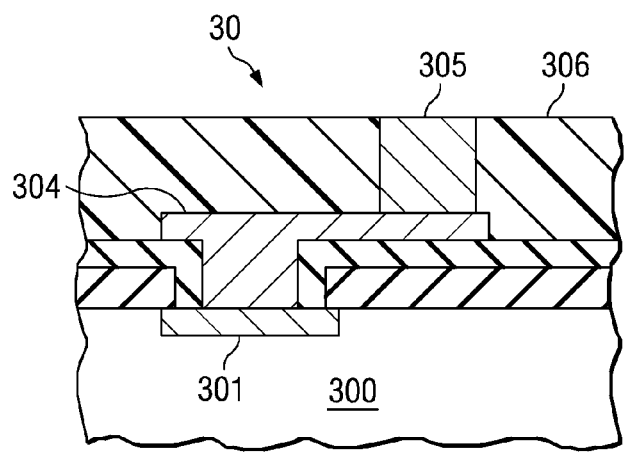

FIG. 3C is a cross-sectional view of another manufacturing stage of WLCSP feature 30 configured according to one embodiment of the present invention. Buffer layer 306 is deposited on top of die 300 to add protection to both die 300 and electrode post 305. In some embodiments, the material selected for buffer layer 306 may be selected based in part on the material's CTE in order to reduce the stress exhibited on the WLCSP packaging because of the varying CTE in the different layers. Example materials for buffer layer 307 may include epoxy, polyimide, or the like. Another selection criteria, for the material of buffer layer 307 in a preferred embodiment of the present invention, may also be the level of resistance that the material exhibits to etchants that may be used to etch the material of electrode post 305.

Figure 3D:
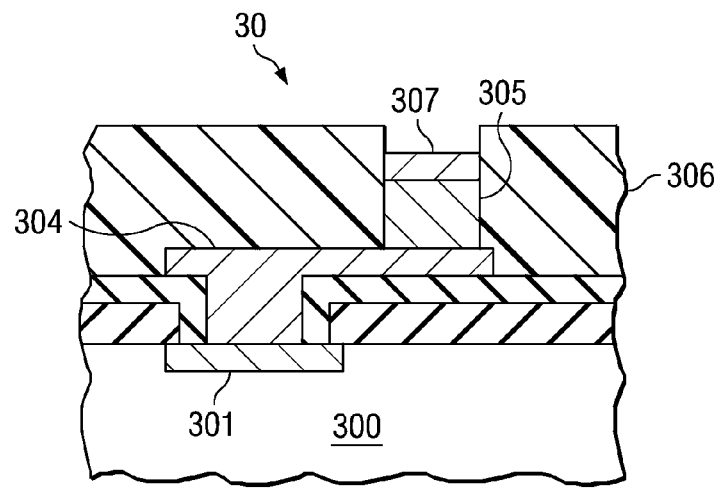

FIG. 3D is a cross-sectional view of another manufacturing step for WLCSP feature 30 configured according to one embodiment of the present invention. Electrode post 305 is etched back below the top of buffer layer 307 using an etchant that does not affect buffer layer 307. In this manner, electrode post 305 may be etched back without using another photoresist layer. After etching back electrode post 305, capping layer 307 is deposited onto electrode post 305, such that the exposed surface of electrode post 305 is covered, but that the top of capping layer 307 is still below the top of buffer layer 307. By covering the exposed surface of electrode post 305, capping layer 307 prevents electrode post 305 from oxidizing. Capping layer 307 is selected from a conductive material so that an electrical connection continues between capping layer 307 and wiring layer 301. For example, capping layer 307 may be selected from materials, such as nickel, tin, or other similar materials or alloys.

Figure 3E:
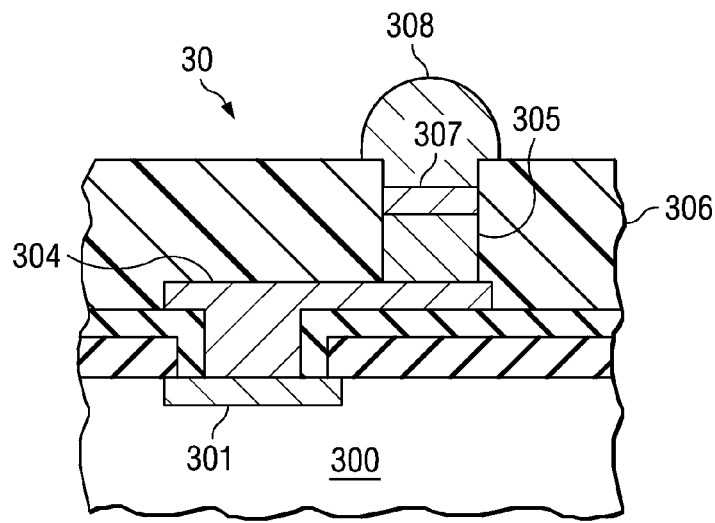

FIG. 3E is a cross-sectional view of WLCSP feature 30. After depositing capping layer 307 onto each of the electrode posts, such as electrode post 305, solder ball 308 is printed or soldered onto electrode post 305/capping layer 307. The joint that forms between solder ball 308 and capping layer 307 is, therefore, located at a level beneath the top of buffer layer 306. Thus, buffer layer 306 provides a protective barrier to the joint. Moreover, the IMC layer that forms at the solder joint is also protected by buffer layer 306. The resulting WLCSP feature 30 exhibits a stronger, more reliable solder joint.

FIGS. 4A-4E are cross-sectional views of semiconductor wafer 40 during various stages of a process of forming a WLCSP feature configured according to one embodiment of the present invention. Semiconductor wafer 40 comprises substrate 400, die contact 401, passivation layer 402, insulation layer 403, and RDL 404. RDL 404 provides a connection link to die contact 401. By using RDL 404, packaging design and development for integrated circuits may be streamlined because the position of the packaging features is not limited to the positioning of the die contact pads, such as die contact 401.

Figure 4A:
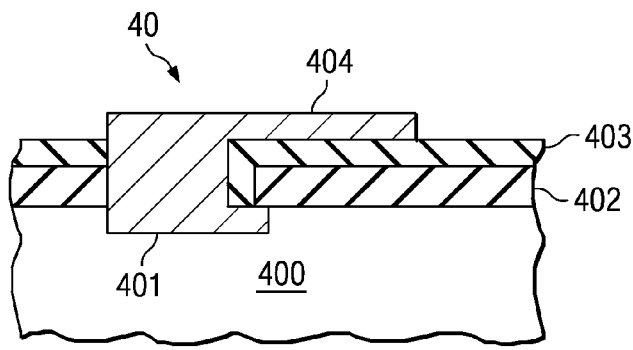
FIGS. 4A-4E are cross-sectional views of a semiconductor wafer during various stages of a process of forming a WLCSP feature configured according to one embodiment of the present invention.
Figure 4B:
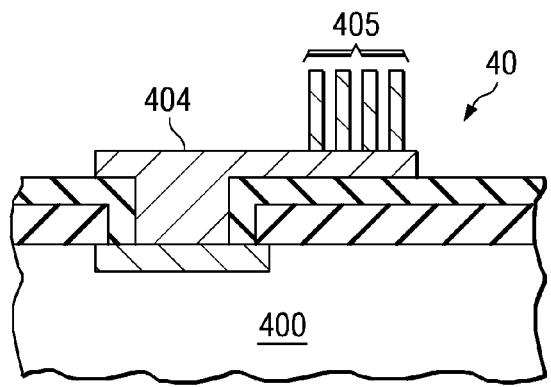

Multi-column electrode post 405 is formed on RDL 404 providing electrical contact with die contact 401, as shown in FIG. 4B. Multi-column electrode post 405 may be formed by any various means or methods for forming metal layers. For example, a photoresist layer or laminate may be placed on top of semiconductor wafer 40 with a recess for each of multi-column electrode post 405 etched therein. The recesses would then be filled with some kind of conducting material, such as copper, nickel, aluminum, tungsten, or the like.

In example implementation of the WLCSP feature illustrated in FIGS. 4A-4E, each column of multi-column electrode post 405 may preferably have an out diameter at some size between approximately 10 μm and 20 μm with a space between successive columns preferably measuring between approximately 10 μm and 20 μm. The encapsulant material, i.e., the stress buffer layer, is then deposited over the feature within these preferred dimensions.

Figure 4C:
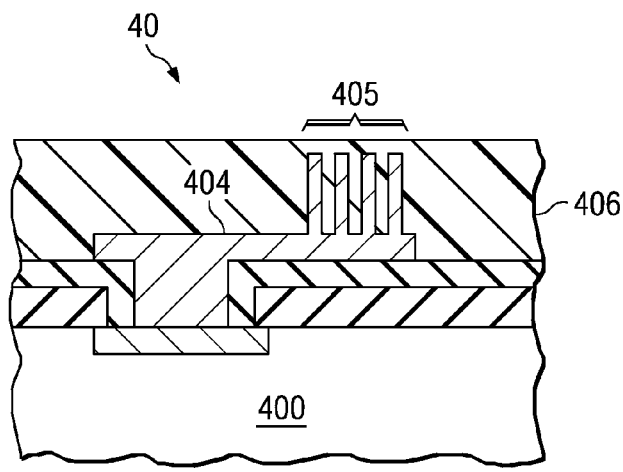
Figure 4D:
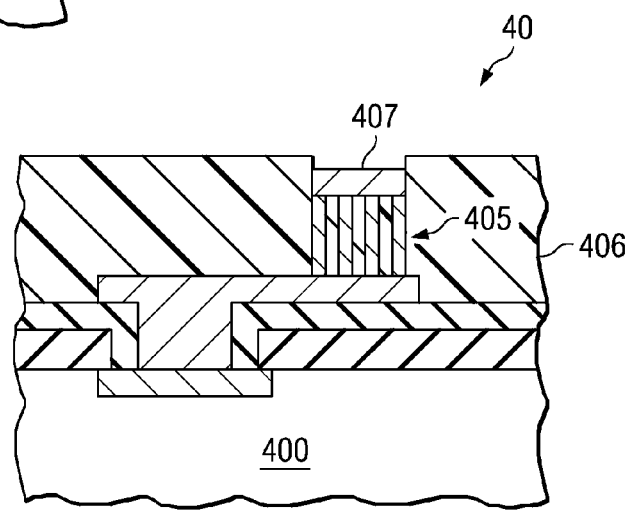

FIG. 4C shows buffer layer 406 deposited on top of semiconductor wafer 40. Buffer layer 406 encapsulates each of the columns of multi-column electrode post 405. This encasement provides strength to multi-column electrode post 405. Buffer layer 406 is etched back to expose multi-column electrode post 405 onto which low-reactive layer 407 is deposited, as shown in FIG. 4D. A low-reactive layer 407 preferably comprises a material that enhances bonding with solder ball or bumps and also has a lower growth rate of IMC defects. Examples of such low-reactive material are nickel, tin, and the like.

Figure 4E:
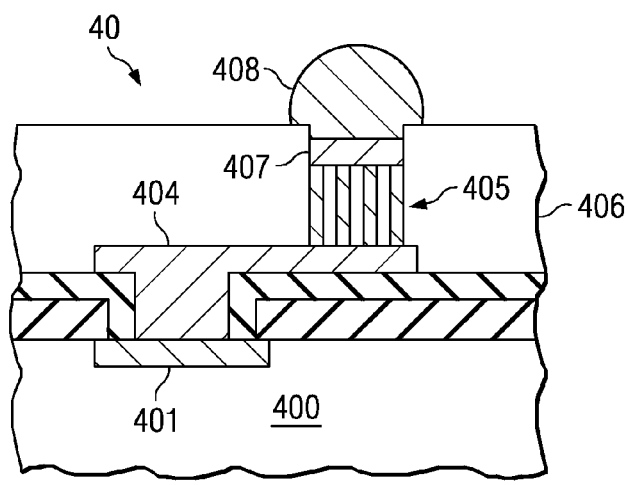

Once low-reactive layer 407 is deposited onto multi-column electrode posts 405, solder ball 408 is printed or placed onto semiconductor wafer 40, as shown in FIG. 4E. Low-reactive layer 407 is placed below the surface of buffer layer 406, such that the ball joint between solder ball 408 and low-reactive layer 407 is below the surface of buffer layer 406. This provides some protection against sheer forces exerted on solder ball 408, while the buffer layer 406 is selected to have a specific coefficient of thermal expansion (CTE) that reduces the thermal expansion stresses on the ball joint, as well.

The multicolumn electrode embodiment illustrated in FIGS. 4A-4E provides an improved performance in package stress resistance over single-column electrode embodiments. First, because the joint with the solder ball is broken up by each of the multiple columns, cracks will not easily propagate across the entire joint. As a crack propagates along a fracture line, it will typically run into one of the columns instead of propagating along the entire length of the joint. Furthermore, the stress buffer layer embedded between the columns enhances the already improved crack resistance due to the metal-buffer composite structure. Materials such as organic stress buffers are beneficial for increasing the crack resistance with the resulting metal-organic composite structure built into the multi-column electrode post structure.

Figure 5A:
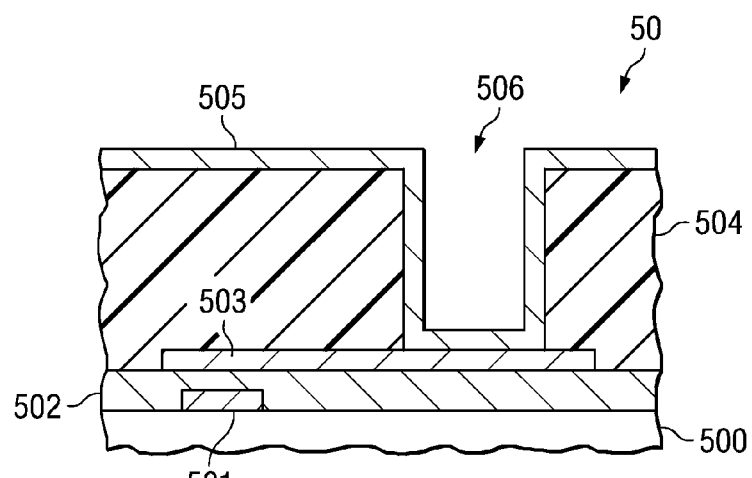
FIGS. 5A-5F are cross-sectional views of a semiconductor wafer during various stages of a process of forming a WLCSP feature configured according to one embodiment of the present invention.
Figure 5B:
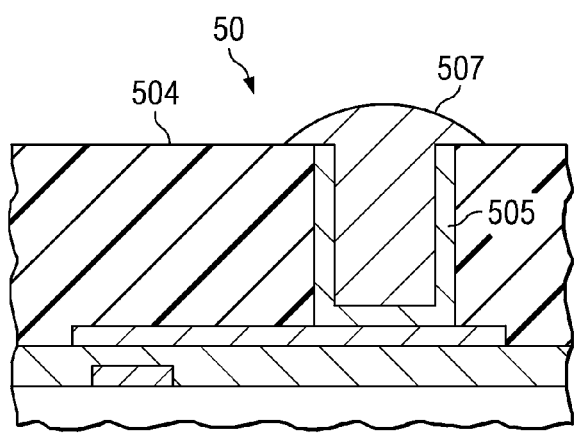

FIGS. 5A-5F are cross-sectional views of semiconductor wafer 50 during various stages of a process of forming a WLCSP feature configured according to one embodiment of the present invention. FIG. 5A illustrates semiconductor wafer 50 comprising integrated circuit (IC) layer 500, contact pad 501, metal plating seed layer 502, RDL 503, and photoresist 504. Recess 506 has been etched into photoresist 504 and is lined with plating metal layer 505. Conducting post 507 is then formed in recess 506, as shown in FIG. 5B.

It should be noted that plating metal layer 505 and conducting post 507 are preferably created from different conducting materials. For example, plating metal layer 505 may comprise nickel, tin, copper, or the like, while conducting post 507 may comprise copper, solder, tin, nickel or the like. When plating metal layer 505 comprises nickel, the solder/copper IMC growth will be reduced. When plating metal layer 505 comprises nickel and conducting post 507 comprises solder, the combined post structure is much more compliant than if rigid copper were used. Thus, the post structure may deform more when the package is under thermal stress, which reduces the stress level at the ball joint.

Figure 5C:
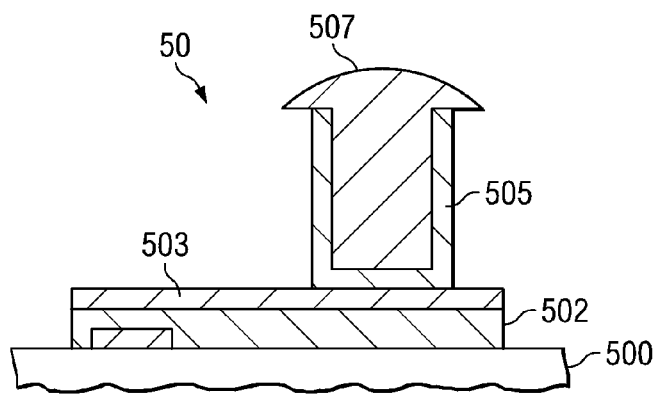
Figure 5D:
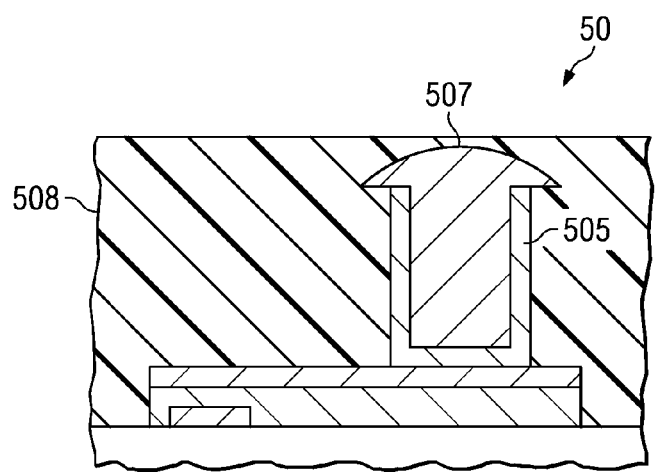
Figure 5E:
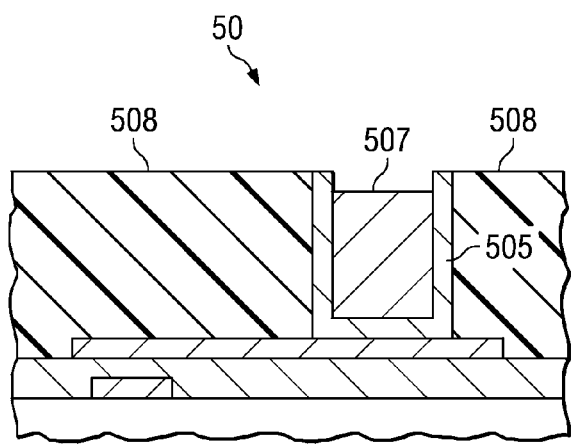
Figure 5F:
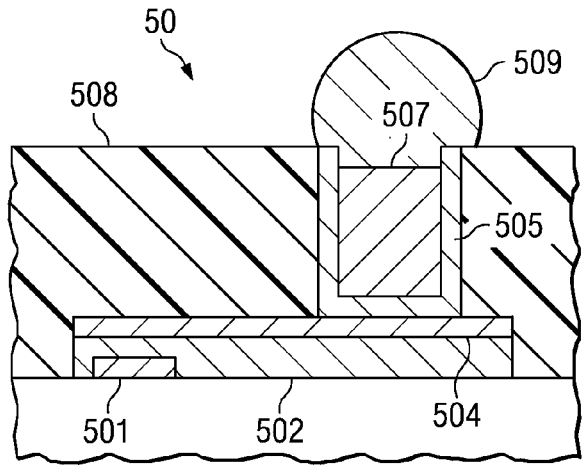

In FIG. 5C, photoresist 504 has been removed and metal plating seed layer 502 is etched back to coincide with RDL 503. Buffer layer 508 is then deposited onto semiconductor wafer 50, as shown in FIG. 5D, encapsulating the packaging elements, including plating metal layer 505 and conducting post 507. The top surface of buffer layer 508 is polished down with conducting post 507 further etched below the surface of buffer layer 508, as shown in FIG. 5E. Solder ball 509 is then printed or placed onto semiconductor wafer 50, as shown in FIG. 5F, such that the ball joint is positioned below the surface of buffer layer 508. By placing the ball joint below the surface, it is effectively positioned away from the higher stress location even with the surface of buffer layer 508. Thus, the ball joint will experience less sheer stress.

Figure 6:
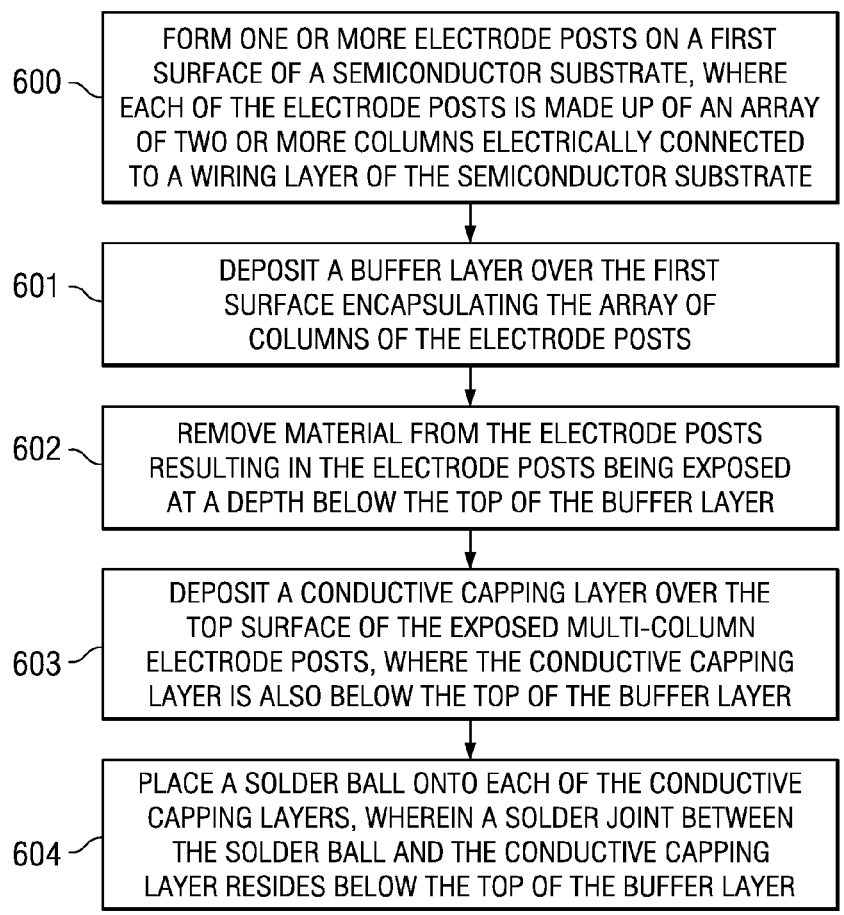
FIG. 6 is a flowchart illustrating example steps executed to implement one embodiment of the present invention.

FIG. 6 is a flowchart illustrating example steps executed to implement one embodiment of the present invention. In step 600, one or more electrode posts are formed on a first surface of a semiconductor substrate, where each of the electrode posts is made up of an array of two or more columns electrically connected to a wiring layer of the semiconductor substrate. A buffer layer is deposited, in step 601, over the first surface encapsulating the array of columns of the electrode posts. Material is removed from the buffer layer, in step 602, resulting in the electrode posts being exposed at a depth below the top of the buffer layer. In step 603, a conductive capping layer is deposited over the top surface of the exposed multi-column electrode posts, where the conductive capping layer is also below the top of the buffer layer. A solder ball is placed onto each of the conductive capping layers, in step 604, where a solder joint between the solder ball and the conductive capping layer resides below the top of the buffer layer.

Figure 7:
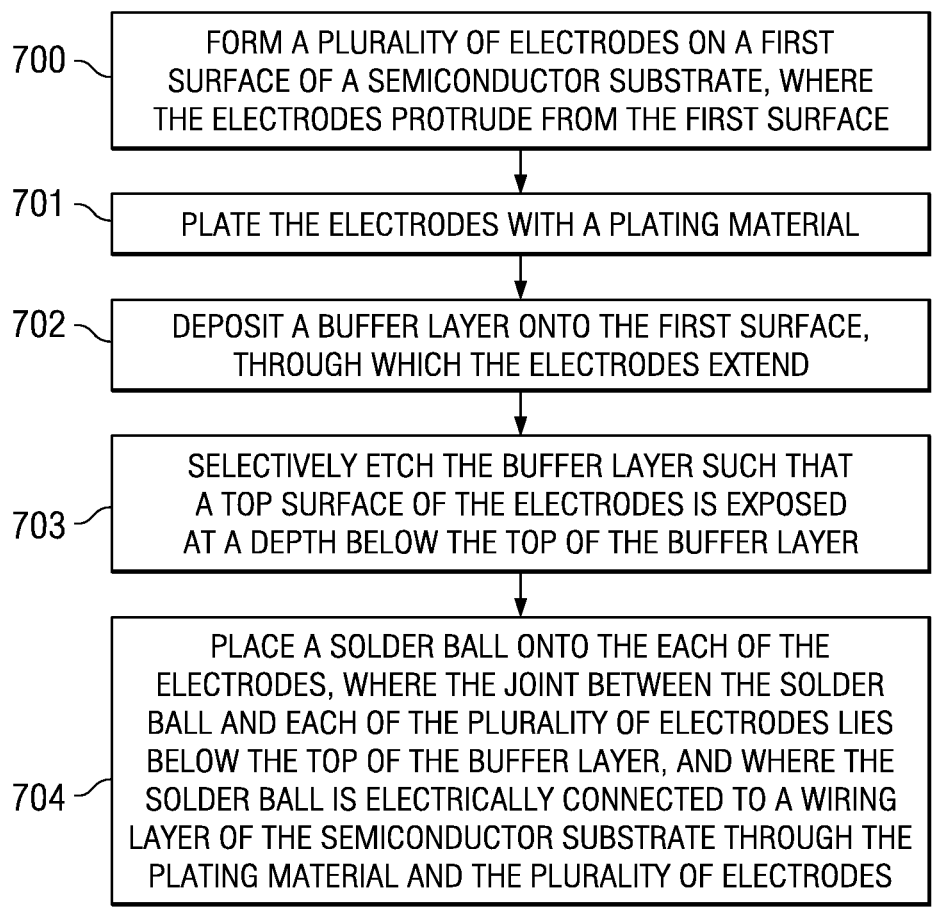
FIG. 7 is a flowchart illustrating example steps executed to implement one embodiment of the present invention.

FIG. 7 is a flowchart illustrating example steps executed to implement one embodiment of the present invention. In step 700, a plurality of electrodes is formed on a first surface of a semiconductor substrate, where the electrodes protrude from the first surface. The electrodes are plated with a plating material, in step 701. A buffer layer is deposited onto the first surface, in step 702, through which the electrodes extend. In step 703, the buffer layer is selectively etched, such that a top surface of the electrodes is exposed at a depth below the top of the buffer layer. In step 703, a solder ball is placed onto the each of the electrodes, where the joint between the solder ball and each of the plurality of electrodes lies below the top of the buffer layer, and where the solder ball is electrically connected to a wiring layer of the semiconductor substrate through the plating material and the plurality of electrodes.

Figure 8:
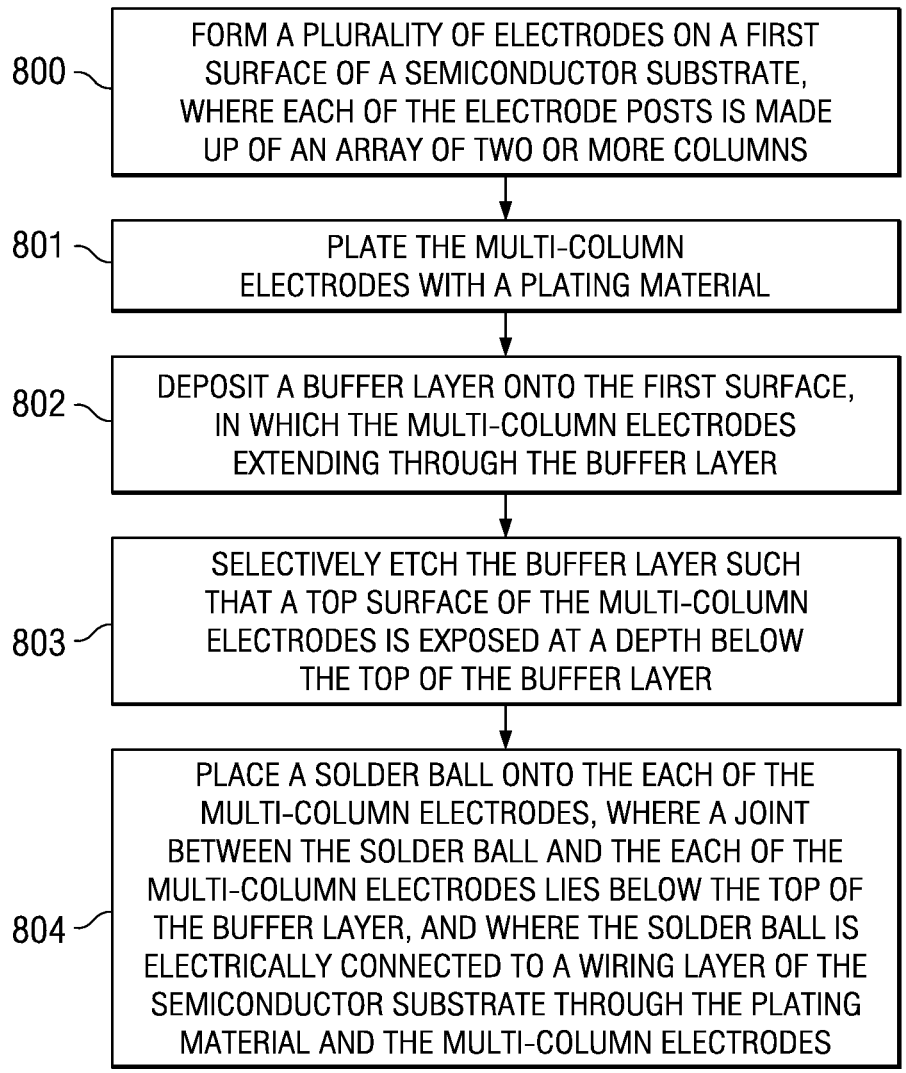
FIG. 8 is a flowchart illustrating example steps executed to implement one embodiment of the present invention.

FIG. 8 is a flowchart illustrating example steps executed to implement one embodiment of the present invention. In step 800, a plurality of electrodes is formed on a first surface of a semiconductor substrate, where each of the electrode posts is made up of an array of two or more columns. The multi-column electrodes are plated with a plating material, in step 801. A buffer layer is deposited onto the first surface, in step 802, in which the multi-column electrodes extending through the buffer layer. The buffer layer is selectively etched, in step 803, such that a top surface of the multi-column electrodes is exposed at a depth below the top of the buffer layer. A solder ball is placed onto the each of the multi-column electrodes, in step 804, where a joint between the solder ball and the each of the multi-column electrodes lies below the top of the buffer layer, and where the solder ball is electrically connected to a wiring layer of the semiconductor substrate through the plating material and the multi-column electrodes.

Although the present invention and its advantages have been described in detail, it should be understood that various changes, substitutions and alterations can be made herein without departing from the spirit and scope of the invention as defined by the appended claims. For example, it will be readily understood by those skilled in the art that the materials, dimensions, and layers may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor device comprising:
    forming one or more re-distribution layers (RDLs) on a first surface of a semiconductor wafer, wherein the one or more RDLs do not extend beyond the first surface of the semiconductor wafer;
    forming one or more electrode posts on respective ones of the RDLs, wherein each of said one or more electrode posts comprises an array of two or more columns, said one or more electrode posts electrically connected to a wiring layer of said semiconductor substrate;
    depositing a buffer layer over said first surface, said buffer layer encapsulating said array and being in physical contact with a conductive portion of at least one of said RDLs;
    removing portions of said buffer layer, the removing portions of said buffer layer resulting in a top surface of said one or more electrode posts being at a depth below a top of remaining portions of said buffer layer;
    depositing a conductive capping layer over said top surface and into the opening, wherein said conductive capping layer is below said top of said remaining portions of said buffer layer; and
    placing a solder ball onto each of said conductive capping layers, wherein a solder joint between said solder ball and said conductive capping layer resides below said top of said remaining portions of said buffer layer, and wherein the solder ball remains outside of a region between the columns of the one or more electrode posts.

2. The method of claim 1 wherein said semiconductor substrate comprises:
    a passivation layer deposited over a semiconductor substrate layer, wherein said top portion of said passivation layer comprises said first surface; and
    a circuit layer in an active region of said semiconductor substrate layer, wherein said circuit layer is electrically connected to said wiring layer.

3. The method of claim 2 wherein said semiconductor substrate further comprises:
    a polymer insulation layer deposited over said passivation layer, wherein a top side of said polymer insulation layer becomes said first surface of said semiconductor substrate.

4. The method of claim 3 wherein a material for said polymer insulation layer is selected based at least in part on the material's coefficient of thermal expansion (CTE).

5. The method of claim 3 wherein said polymer insulation layer is made from a material selected from the group consisting essentially of
    epoxy; and
    polyimide.

6. The method of claim 1 wherein said removing comprises:
    etching said buffer layer.

7. The method of claim 1 wherein said depositing said conductive capping layer comprises:
    depositing said conductive capping layer through electroless plating.

8. The method of claim 1 wherein said conductive capping layer is made from a material selected from a group consisting essentially of:
    nickel; and
    tin.

9. A method for manufacturing a semiconductor device comprising:
    forming a conductive line on a first surface of a semiconductor substrate, wherein the conductive line extends no further than the semiconductor substrate;
    forming a plurality of electrodes on the conductive line, wherein said plurality of electrodes protrude from the conductive line;
    plating said plurality of electrodes with a plating material, the plating material forming a planar layer;
    depositing a buffer layer onto and in physical contact with the conductive line, said plurality of electrodes extending through said buffer layer;
    selectively etching said buffer layer such that a top surface of said plurality of electrodes is exposed at a depth below a top of said buffer layer, the selectively etching exposing an entire top surface of at least one of said plurality of electrodes;
    placing a solder ball onto said each of said plurality of electrodes, wherein a joint between said solder ball and said each of said plurality of electrodes lies below said top of said buffer layer, and wherein said solder ball is electrically connected to a wiring layer of said semiconductor substrate through said plating material and said plurality of electrodes.

10. The method of claim 9 further comprising:
    a passivation layer deposited over a semiconductor substrate layer, wherein said top portion of said passivation layer comprises said first surface; and
    a polymer insulation layer deposited over said passivation layer, wherein a top side of said polymer insulation layer becomes said first surface of said semiconductor substrate, wherein a material for said polymer insulation layer is selected based at least in part on the material's coefficient of thermal expansion (CTE).

11. The method of claim 9 wherein said forming said plurality of electrodes comprises:
    forming two or more columns connected at a first end to said wiring layer, wherein said two or more columns are formed for each of said plurality of electrodes.

12. The method of claim 9 wherein said plating material comprises one of:
    copper;
    nickel; and
    tin.

13. The method of claim 9 wherein said plurality of electrodes is made from a material comprising one of:
    copper;
    solder;
    nickel; and
    tin.

* * * * *